United States Patent
Liang et al.

(10) Patent No.: US 10,826,009 B2
(45) Date of Patent: Nov. 3, 2020

(54) QUANTUM DOT LIGHT-EMITTING DIODE AND DISPLAY APPARATUS THEREOF

(71) Applicant: TCL TECHNOLOGY GROUP CORPORATION, Huizhou (CN)

(72) Inventors: Zhurong Liang, Huizhou (CN); Weiran Cao, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 0 days.

(21) Appl. No.: 16/348,295

(22) PCT Filed: Aug. 25, 2017

(86) PCT No.: PCT/CN2017/099061
§ 371 (c)(1),
(2) Date: May 8, 2019

(87) PCT Pub. No.: WO2018/090691
PCT Pub. Date: May 24, 2018

(65) Prior Publication Data
US 2020/0058889 A1    Feb. 20, 2020

(30) Foreign Application Priority Data

Nov. 18, 2016 (CN) .......................... 2016 1 1015977

(51) Int. Cl.
*H01L 51/50* (2006.01)
*H01L 33/06* (2010.01)
(Continued)

(52) U.S. Cl.
CPC ............ *H01L 51/502* (2013.01); *H01L 33/06* (2013.01); *H01L 33/26* (2013.01);
(Continued)

(58) Field of Classification Search
None
See application file for complete search history.

(56) References Cited

U.S. PATENT DOCUMENTS

2011/0284819 A1* 11/2011 Kang .................... H05B 33/10
                                                                257/9
2015/0001464 A1*  1/2015 Fukuura ............... C09K 11/025
                                                                257/13
(Continued)

FOREIGN PATENT DOCUMENTS

CN        101728082 A       6/2010
CN        104409642 A       3/2015
(Continued)

OTHER PUBLICATIONS

The World Intellectual Property Organization (WIPO) International Search Report for PCT/CN2017/099061 dated Nov. 30, 2017 6 pages.

*Primary Examiner* — Dung A. Le
(74) *Attorney, Agent, or Firm* — Anova Law Group, PLLC

(57) ABSTRACT

A quantum dot light-emitting diode and a display apparatus comprising the quantum dot light-emitting diode are provided. The quantum dot light-emitting diode comprises an anode, a hole injecting layer, a hole transporting layer, a quantum dot light-emitting layer, an electron transporting layer and a cathode from bottom to top, wherein the materials of the quantum dot light-emitting layer contain quantum dots and CuSCN nano-particles. By blending quantum dots and CuSCN nano-particles into a membrane to prepare a quantum dot light-emitting layer, a hole trap state on the surface of the quantum dots is passivated, and the transporting effect of a hole is improved, so that the injection of holes (Continued)

in the quantum dot light-emitting diode and that of electrons achieve balance, and thus the light-emitting efficiency and stability are improved.

5 Claims, 3 Drawing Sheets

(51) Int. Cl.
*H01L 33/26* (2010.01)
*H01L 51/00* (2006.01)

(52) U.S. Cl.
CPC ...... *H01L 51/0003* (2013.01); *H01L 51/5004* (2013.01); *H01L 2251/301* (2013.01); *H01L 2251/558* (2013.01)

(56) References Cited

U.S. PATENT DOCUMENTS

| | | | |
|---|---|---|---|
| 2016/0240730 A1* | 8/2016 | Murayama | H01L 33/06 |
| 2016/0358539 A1 | 12/2016 | Zhang et al. | |
| 2020/0144340 A1* | 5/2020 | Barkowski | G09F 9/301 |

FOREIGN PATENT DOCUMENTS

| | | |
|---|---|---|
| CN | 104464632 A | 3/2015 |
| CN | 106384767 A | 2/2017 |
| EP | 3239969 A1 | 11/2017 |
| WO | 2016101442 A1 | 6/2016 |

* cited by examiner

Prior art

QUANTUM DOT LIGHT-EMITTING DIODE AND DISPLAY APPARATUS THEREOF

CROSS-REFERENCES TO RELATED APPLICATIONS

This application is a national stage application of PCT Patent Application No. PCT/CN2017/099061, filed on 25 Aug. 2017, which claims priority to Chinese Patent Application No. 2016/11,015,977.6, filed on 18 Nov. 2016, the content of all of which is incorporated herein by reference.

TECHNICAL FIELD

The present disclosure relates to the field of quantum dot(QD) light-emitting diode technology, and more particularly, to a QD light-emitting diode and a preparation method therefor, and a light-emitting module and a display apparatus.

BACKGROUND

A QD light-emitting diode (QLED) based on a fluorescent semiconductor has a plurality of advantages including a high color purity, a good stability, a long life, a good color temperature, and a simple preparation process, which has a huge application prospect in a flat panel displayer and a solid-state lighting of a next generation A performance of a QD material and a QLED device has been improved rapidly, through a continuous effort of a plurality of researchers. However, the QLED in the present art still has a plurality of problems to be solved, including a light-emitting efficiency is still far away from an industrial production, an exploration for a large-scale preparation process and more. Wherein in the QLED devices, an injection imbalance of a carrier (an electron and a hole) is a key factor affecting the light-emitting efficiency of the QLED devices and a lifetime of the devices. For example, a valence band of a core-shell QD widely used and based on a CdSe@ZnS (Cadmium selenide @Zinc Sulfide) is generally higher than 6 eV, while a HOMO energy level of most organic holes transport layers is lower than 6 eV, thus there is a limitation existing when the hole is transported from the organic holes transport layer to a QD light-emitting layer, whereas a QD conduction band is generally higher than 4 eV, and an electron is easily injected from an electron transport layer into the QD light-emitting layer. A difficulty of the injection of holes is different to that of the electrons, resulting in a number of the holes and a number of the electrons imbalance in the QD light-emitting layer, while excess electrons accumulate in the QD light-emitting layer, causing the QDs to carry a charge, thus a plurality of excitons are easy to generate an auger recombination, causing the luminescence to annihilate, greatly affecting the light-emitting efficiency of the device. In addition, there are a large plurality of hole trap states on a surface of the QD, shown as FIG. 1, wherein, 10 is a holes transport layer, 11 is a QD, 12 is an electrons transport layer, and the QDs are also easily agglomerated, and generating a concentration quenching. All of these are seriously affecting a performance of the QLED devices.

In order to solve a problem mentioned above of the injection imbalance between the holes and the electrons in the QLED devices, a plurality of searchers have tried various methods, including introducing an ultra-thin insulating material between the electrons transport layer and the QD light-emitting layer to slow down an injection rate of the electrons, however the QLED devices obtained by this method have a complicated structure, a cumbersome process, and it is hard to control a thickness of an insulating layer, not conducive to a mass production. In addition, some researchers have blended the QDs with a plurality of conductive polymers including polyvinylcarbazole (PVK), blocking the injection of the electrons but improving the injection of the holes by using an energy level characteristic of the PVK, however a compatibility between an organic polymer and an inorganic QD is poor, causing a poor film formation effect, resulting in an uneven distribution of the QDs in a mixture layer of the organic polymer-QD, and the exciton is also easy to have an Auger recombination, affecting a performance of the device. In addition, it has also been reported that, a doped or undoped inorganic holes transport material such as NiO (Nickel oxide), CuO (cupric oxide), $MoO_3$ (molybdenum trioxide) or the like has been used as a holes transport layer, to substitute a conventional organic holes transport material, although it is possible to improve the injection effect of the holes to some extent, a problem of the carrier injection imbalance in the QLED devices is still unable to overcome.

Therefore, the current technology needs to be improved and developed.

BRIEF SUMMARY OF THE DISCLOSURE

According to the defects described above in the prior art, the purpose of the present disclosure is providing a QD light-emitting diode and a preparation method therefor, and a light-emitting module and a display apparatus, in order to solve the problems in the prior art that the carrier injection imbalance in the QLED devices.

In order to solve the technical problems mentioned above, the technical solution of the present disclosure is as follows:

A QD light-emitting diode, wherein the QD light-emitting diode comprises an anode, a cathode, and a QD light emitting layer arranged between the anode and the cathode;

wherein a material of the QD light-emitting layer comprises a plurality of QDs and a plurality of CuSCN (Copper thiocyanate) nanoparticles.

The QD light-emitting diode further comprises a holes injection layer arranged between the anode and the QD light emitting layer, a holes transport layer arranged between the holes injection layer and the QD light emitting layer, and an electrons transport layer arranged between the cathode and the QD light-emitting layer, the holes transport layer overlays the QD light-emitting layer.

The QD light-emitting diode, wherein a mass ratio between the QDs and the CuSCN nanoparticles is 0.001~20:1.

The QD light-emitting diode, wherein a thickness of the QD light-emitting layer is 10~100 nm.

The QD light-emitting diode, wherein a size range of the CuSCN nanoparticles is 0.5~50 nm.

A preparation method of the QD light-emitting diode described in any one above, wherein comprising:

prepare a QD light-emitting layer on the anode; wherein the QD light-emitting layer is prepared by the QDs and the CuSCN nanoparticles;

prepare a cathode on the QD light-emitting layer, and form the QD light-emitting diode.

The preparation method of the QD light-emitting diode, wherein the step of preparing the QD light-emitting layer on the anode includes specifically: depositing a mixture of the QDs and the CuSCN nanoparticles on the anode by a solution method, to form a QD light-emitting layer containing the CuSCN nanoparticles.

The preparation method of the QD light-emitting diode, wherein the step of preparing the QD light-emitting layer on the anode includes specifically: blending the QDs and the CuSCN nanoparticles, before depositing on the anode through an evaporation method, and forming a QD light-emitting layer containing the CuSCN nanoparticles.

The preparation method of the QD light-emitting diode, wherein further comprising:

step A, prepare a holes injection layer on the anode;

step B, then prepare a holes transport layer on the holes injection layer;

step C, followed by preparing a QD light-emitting layer on the holes transport layer; wherein the QD light-emitting layer is prepared from a mixture of the QDs and the CuSCN nanoparticles;

step D: finally, prepare an electrons transport layer on the QD light-emitting layer, and vapor deposit a cathode on the electrons transport layer before forming a QD light-emitting diode.

The preparation method of the QD light-emitting diode, wherein the step C includes specifically: spin-coat a mixture of the QDs and the CuSCN nanoparticles on the holes transport layer to form a QD light-emitting layer containing the CuSCN nanoparticles.

The preparation method of the QD light-emitting diode, wherein in the mixture, a concentration of the QDs is 1~50 mg/mL, and a concentration of the CuSCN nanoparticles is 0.001~50 mg/m L.

The preparation method of the QD light-emitting diode, wherein in the mixture, the concentration of the QDs is 10~20 mg/mL, and the concentration of the CuSCN nanoparticles is 0.01~10 mg/mL.

The preparation method of the QD light-emitting diode, wherein a mass ratio between the QDs and the CuSCN nanoparticles is 0.001~20:1.

A light-emitting module, wherein comprising the QD light-emitting diode described above.

A display apparatus, wherein comprising the light-emitting module described above.

Benefits: the present disclosure blends the QDs and the CuSCN nanoparticles into a membrane to prepare the QD light-emitting layer, and passivates a hole trap state on a surface of the QDs, as well as improving a transport effect of the holes, making an injection of the holes and the electrons in the QLED achieve a balance, thus improving a light-emitting efficiency and a stability of the QLED.

DETAILED DESCRIPTION OF EMBODIMENTS

The present disclosure provides a QD light-emitting diode and a preparation method therefor, and a light-emitting module and a display apparatus, in order to make the purpose, technical solution and the advantages of the present disclosure clearer and more explicit, further detailed descriptions of the present disclosure are stated here, referencing to the attached drawings and some preferred embodiments of the present disclosure. It should be understood that the detailed embodiments of the disclosure described here are used to explain the present disclosure only, instead of limiting the present disclosure.

Figure 1:
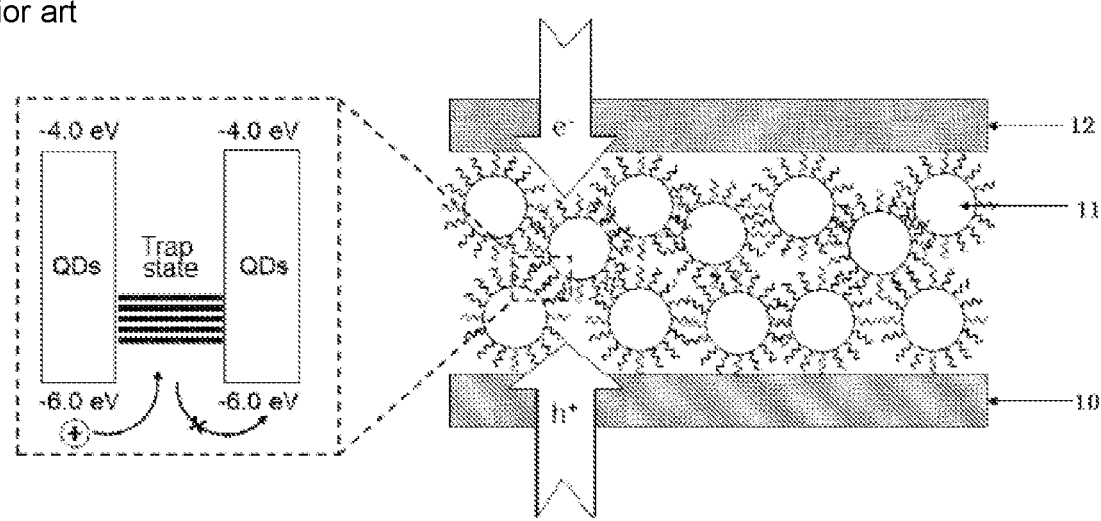
FIG. 1 illustrates a diagram on a transport mechanism of a carrier in the QD light-emitting layer in a conventional QD light-emitting diode.
Figure 2:
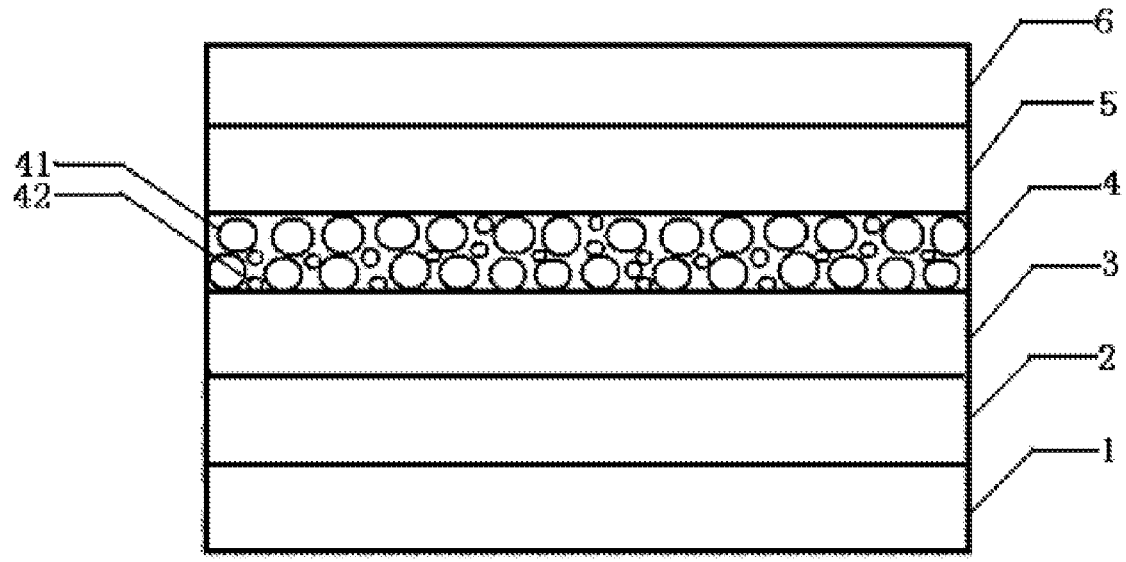
FIG. 2 illustrates a schematic diagram on a preferred embodiment of the QD light-emitting diode disclosed in the present disclosure.

Referencing to FIG. 2, which illustrates a schematic diagram on a preferred embodiment of the QD light-emitting diode disclosed in the present embodiment, shown as the figure, the QD light-emitting diode comprises sequentially from bottom up, an anode 1, a holes injection layer 2, a holes transport layer 3, a QD light-emitting layer 4, an electron transport layer 5 and a cathode 6; wherein a material of the QD light-emitting layer 4 comprises a plurality of QDs 41 and a plurality of CuSCN nanoparticles 42.

Figure 3:
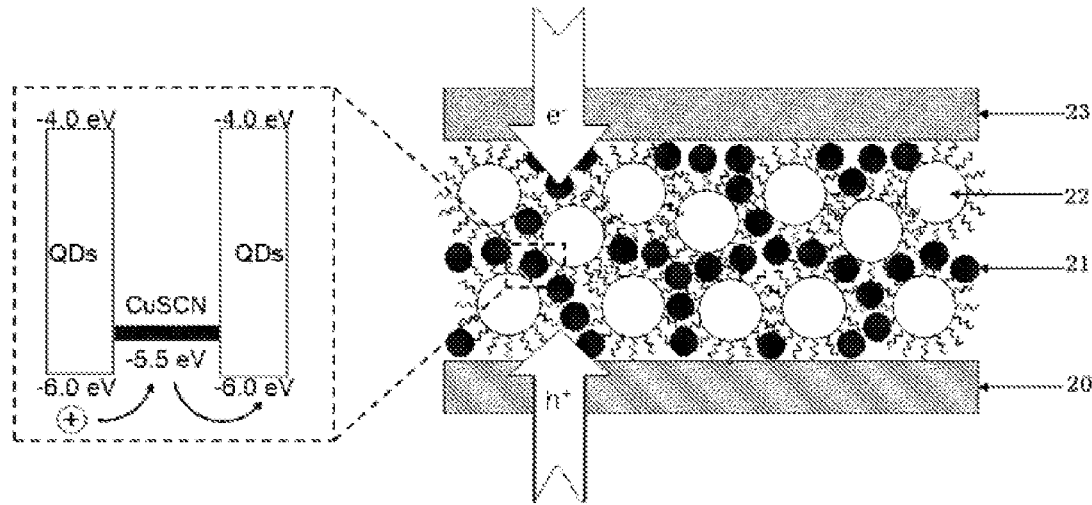
FIG. 3 illustrates a diagram on a transport mechanism of a carrier in the QD light-emitting layer of the QD light-emitting diode disclosed in the present disclosure.

The present embodiment forms a membrane from a mixture containing a plurality of QDs and a plurality of CuSCN nanoparticles, to prepare a QD light-emitting layer, because the CuSCN nanoparticles used has not only an excellent holes transport ability, but also a rich source and a lower cost. In addition, as shown in FIG. 3, wherein 20 is a holes transport layer, 21 is a plurality of CuSCN nanoparticles, 22 is a plurality of QDs, and 23 is an electrons transport layer, through blending the CuSCN nanoparticles 21 and the QDs 22, and forming a membrane, a plurality of tiny CuSCN nanoparticles 21 are filling in a plurality of gaps between the QDs 22, acting as an additive for a holes transport, which on one hand, is able to passivate a hole trap state on a surface of the QDs 22, and on the other hand, is acting as a bridge for the holes transport in the QD light-emitting layer, improving a holes transport effect, and overcomes effectively a plurality of problems including a carrier (a hole and an electron) injection imbalance causing a device performance degradation in a QLED device.

The present embodiment dissolves the QDs and the CuSCN nanoparticles in a solvent, and forms a mixture, before depositing the mixture and forming a QD light-emitting layer containing a plurality of CuSCN nanoparticles. Wherein a mass ratio between the QDs and the CuSCN nanoparticles is 0.001~20:1.

Preferably, a thickness of the QD light-emitting layer described in the present embodiment is 10~100 nm, for example, the thickness may be 50 nm, 80 nm or 100 nm.

Preferably, a size range of the CuSCN nanoparticles described in the present embodiment is 0.5~50 nm, for example, the size range may be 5 nm, 10 nm or 30 nm.

The CuSCN nanoparticles described in the present embodiment may be a doped or undoped CuSCN material. The CuSCN nanoparticles may be prepared by a chemical method or a physical method, wherein the chemical method includes but not limited to, a sol-gel method, a chemical bath deposition method, a chemical vapor deposition method, a hydrothermal method, a co-precipitation method, and an electrochemical deposition method; the physical method includes but not limited to, a thermal evaporation coating method, an electron beam evaporation coating method, a magnetron sputtering method, a multi-arc ion plating method, and an electrolysis method.

The CuSCN nanoparticles embedding in the gaps between the QDs, on one hand, it is able to passivate the hole trap state on the surface of the QDs, and on the other hand, it is able to reduce an energy barrier of the holes injecting into the QDs, improving a transport efficiency of the holes, making an injection number in the QD light-emitting layer between the holes and the electrons get balanced, thus improving a light-emitting efficiency of the QLED device.

Specifically, the QDs of the present embodiment may be, but not limited to, one or more of an II-V compound semiconductor, an III-V compound semiconductor, an IV-VI compound semiconductor and a core-shell structure thereof.

Specifically, the anode of the present embodiment may be, but not limited to, one or more of indium doped tin oxide (ITO), fluorine doped tin oxide (FTO), antimony doped tin oxide (ATO), and aluminum doped zinc oxide (AZO).

Specifically, the holes injection layer may be, but not limited to, one or more of poly(3,4-ethylenedioxythiophene)-polystyrene sulfonic acid (PEDOT:PSS), CuPc (Copper(II) phthalocyanine), F4-TCNQ (2,3,5,6-Tetrafluoro-7,7,8,8-tetracyanoquinodimethane), HATCN (dipyrazino[2,34:2',3'-h]quinoxaline-2,3,6,7,10,11-hexacarbonitrile), undoped transition metal oxide, doped transition metal oxide, metal sulfur group compound, doped metal sulfur group compound. Wherein, the transition metal oxide may be, but not limited to, $MoO_3$, $VO_2$, $WO_3$, $CrO_3$, CuO or a mixture thereof; the metal sulfur group compound may be, but not limited to, $MoS_2$, $MoSe_2$, $WS_2$, $WSe_2$, CuS or a mixture thereof.

Specifically, the holes transport layer in the present embodiment may be selected from an organic material having a holes transport ability, and may be, but not limited to, poly(9,9-dioctylfluorene-co-N-(4-butylphenyl)diphenylamine) (TFB), polyvinyl carbazole (PVK), poly(N,N'-bis (4-butylphenyl)-N,N'-bis(phenyl)-benzidine) (poly-TPD), poly(9,9-dioctylfluorene-co-bis-N,N-phenyl-1,4-phenylenediamine) (PFB), 4,4',4"-tris(carbazol-9-yl)-triphenylamine (TCTA), 4,4'-bis(carbazol-9-yl)biphenyl (CBP), N,N'-bis(3-methylphenyl)-N,N'-bis(phenyl)-1,1'-biphenyl-4,4'-diamine(TPD), N, N'-bis-(1-naphthalenyl)-N,N'-bis (phenyl)-1,1'-biphenyl-4,4'-diamine(NPB), doped graphene, undoped graphene, C60 or a mixture thereof.

Specifically, the holes transport layer in the present embodiment may further be selected from an inorganic material having the holes transport ability, and may be, but not limited to, NiO, $WO_3$, $MoO_3$, CuO, $VO_2$, $CrO_3$, $MoS_2$, $MoSe_2$, $WS_2$, $WSe_2$, CuS, or a mixture thereof.

Specifically, a material of the electrons transport layer in the present embodiment may be one or more of n-type ZnO, $TiO_2$, $SnO_2$, $Ta_2O_3$, AlZnO, ZnSnO, InSnO, $Alq_3$, Ca, Ba, CsF, LiF, $CsCO_3$. Preferably, the electrons transport layer is n-type ZnO, an n-type $TiO_2$.

Specifically, a material of the cathode in the present embodiment may be, but not limited to, one or more of Al, Ag, Cu, Mo, Au, or an alloy thereof.

The QD light-emitting diode of the positive structures described above in the present embodiment is not limited to the functional layers described above, and may further include an interface functional layer or an interface modification layer, which includes but not limited to, one or more of an electron blocking layer, a hole blocking layer, an electrode modification layer and an isolation protection layer.

It should be noted that the mixture of the QDs and the CuSCN nanoparticles in the present embodiment is not limited to preparing a QD light-emitting diode having a positive structure, but also being able to prepare a QD light-emitting diode having an inverted structure. The QD light-emitting diode having the inverted structure is not limited to the functional layers described above, and may further include an interface functional layer or an interface modification layer, which comprises, but not limited to, one or more of the an electron blocking layer, a hole blocking layer, an electrode modification layer, and an isolate protection layer.

The present embodiment further provides a light-emitting module, which comprises the QD light-emitting diode described above.

The present embodiment further provides a display apparatus, which comprises the QD light-emitting diode described above, or the light-emitting module described above.

Figure 4:
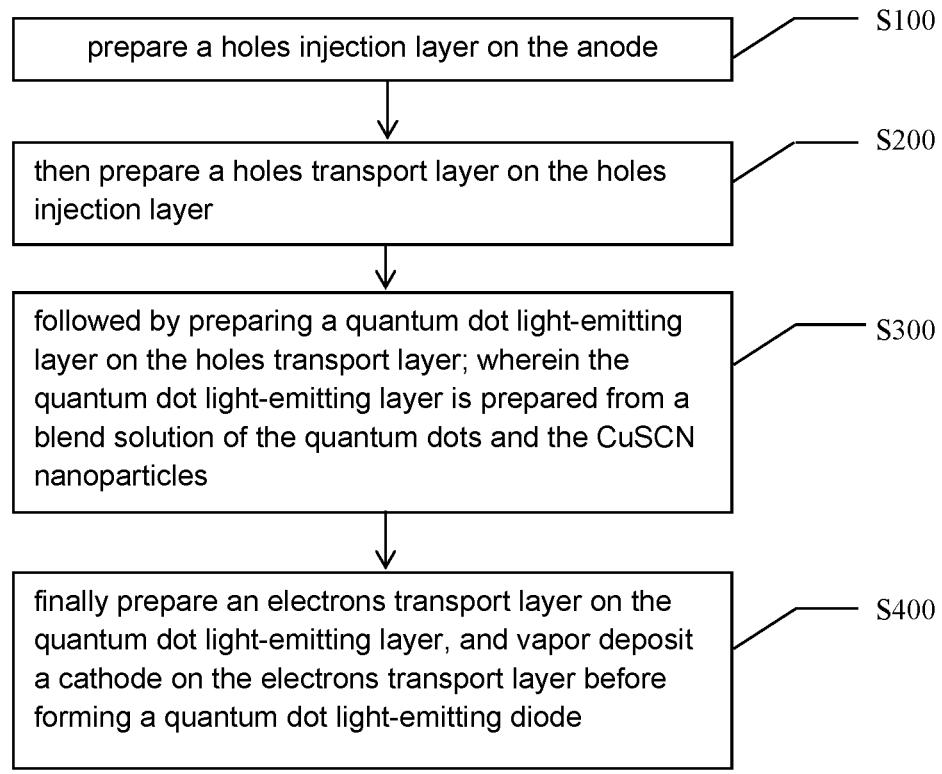
FIG. 4 illustrates a flow chart on a preferred embodiment of the preparation method of the QD light-emitting diode disclosed in the present disclosure.

Based on the QD light-emitting diode, the present embodiment further provides a flow chart on a preferred embodiment of a preparation method of the QD light-emitting diode disclosed in the present embodiment, shown as FIG. 4, comprising:

step S100, prepare a holes injection layer on the anode;

step S200, then prepare a holes transport layer on the holes injection layer;

step S300, followed by preparing a QD light-emitting layer on the holes transport layer; wherein the QD light-emitting layer is prepared from a mixture of the QDs and the CuSCN nanoparticles;

step S400: finally prepare an electrons transport layer on the QD light-emitting layer, and vapor deposit a cathode on the electrons transport layer before forming a QD light-emitting diode.

Specifically, the step S300 of the present embodiment comprises: spin-coat a mixture of the QDs and the CuSCN nanoparticles on the holes transport layer to form a QD light-emitting layer containing the CuSCN nanoparticles.

The present embodiment blends the QDs with the CuSCN nanoparticles, before forming a CuSCN-enhanced QD light-emitting layer by an evaporation method or a solution film formation method including a plurality of processes of a spin coating, an ink spraying, a blade coating or the like.

The present embodiment dissolves the QDs and the CuSCN nanoparticles in a solvent to form a mixture, before depositing the mixture and forming a QD light-emitting layer containing the CuSCN nanoparticles. Wherein, a mass ratio of the QDs to the CuSCN nanoparticles is 0.001~20:1. In the mixture, a concentration of the QDs is 1 to 50 mg/mL, a concentration of the CuSCN nanoparticles is 0.001 to 50 mg/mL. Preferably, in the mixture, a concentration of the QDs is 10-20 mg/mL, and a concentration of the CuSCN nanoparticles is 0.01-10 mg/mL. A solvent used in the mixture may be, but not limited to, one or more of an n-octane, an isooctane, a toluene, a benzene, a chlorobenzene, a xylene, a chloroform, an acetone, a cyclohexane, an n-hexane, an n-pentane, an isopentane, an n-butyl ether, an anisole, a phenethyl ether, an acetophenone, an aniline, a diphenyl ether, an N,N-dimethylformamide, an N-methylpyrrolidone, a dimethyl sulfoxide, a hexamethylphosphoramide.

The preparation method of the functional layers described above of the present embodiment may be a chemical method or a physical method, wherein the physical method includes, but not limited to, a spin coating method, a spray coating method, a roll coating method, a typing method, a printing method, an inkjet method, a dip coating method, a thermal evaporation coating method, an electron beam evaporation coating method, a magnetron sputtering method, a multi-arc ion plating method; the chemical methods include, but not limited to, a chemical vapor deposition method, a successive ionic layer adsorption and reaction method, an anodization method, an electrolytic deposition method, a coprecipitation method.

The preparation method disclosed in the present embodiment is simple, and may solve effectively a plurality of problems in the prior art of a poor film formation, a complicated structure, a high material cost and a difficult industrialization. In addition, the prepared device has an excellent performance, a good stability, and a long service life.

A detailed description is listed herein, taking a preparation process of the QD light-emitting layer and a preparation process of the QLED device as examples.

EXAMPLE 1

1) Prepare a mixture of the CuSCN nanoparticles and the QDs: dissolve 10 mg CuSCN powder and 15 mg CdSe@ZnS QDs in 1 mL n-octane, mix well and form a uniform mixture.

Figure 5:
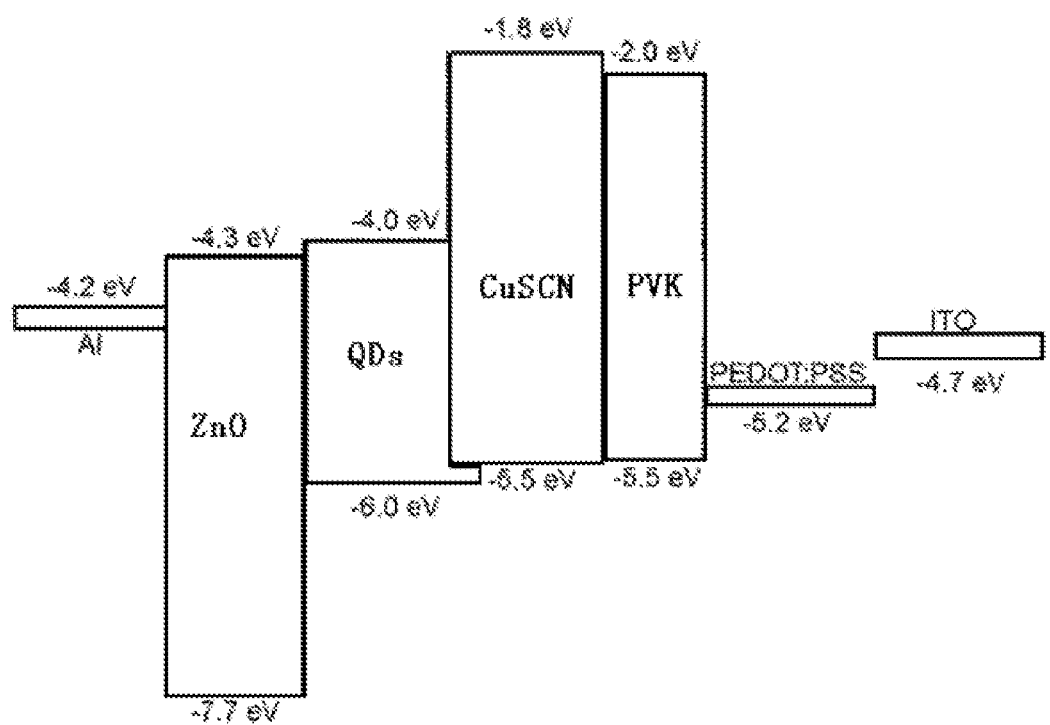
FIG. 5 illustrates a schematic diagram on an energy level of the QD light-emitting diode in the example 1 of the present disclosure.

2). A plurality of preparation steps of the QLED device is as follows: spin coat a layer of the PEDOT:PSS holes injection layer on the ITO substrate; spin coat a layer of the PVK holes transport layer on the PEDOT:PSS holes injection layer;

3). Spin-coat the mixture of the CuSCN nanoparticles and the QDs on the PVK holes transport layer, and form a QD light-emitting layer containing the CuSCN nanoparticles;

4). Followed by spin-coating a layer of the ZnO electrons transport layer on the QD light-emitting layer;

5). Finally, an Al cathode is evaporated on the ZnO electrons transport layer, to obtain the QD light-emitting diode, whose energy level structure is shown in FIG. 5.

EXAMPLE 2

1) Prepare a mixture of the CuSCN nanoparticles and the QDs: dissolve 5 mg CuSCN powder and 15 mg CdSe@ZnS QDs in 1 mL n-octane, mix well and form a uniform mixture.

2). A plurality of preparation steps of the QLED device is as follows: spin coat a layer of the PEDOT:PSS holes injection layer on the ITO substrate;

spin coat a layer of the PVK holes transport layer on the PEDOT:PSS holes injection layer;

3). Spin-coat the mixture of the CuSCN nanoparticles and the QDs on the PVK holes transport layer, and form a QD light-emitting layer containing the CuSCN nanoparticles;

4). Followed by spin-coating a layer of the ZnO electrons transport layer on the QD light-emitting layer;

5). Finally, an Al cathode is evaporated on the ZnO electrons transport layer, to obtain the QD light-emitting diode.

EXAMPLE 3

1) Prepare a mixture of the CuSCN and the QDs: dissolve 0.1 mg CuSCN powder and 15 mg CdSe@CdS@ZnS QDs in 1 mL n-octane, mix well and form a uniform mixture.

2). A plurality of preparation steps of the QLED device is as follows: spin coat a layer of the PEDOT:PSS holes injection layer on the ITO substrate; spin coat a layer of the TFB holes transport layer on the PEDOT:PSS holes injection layer;

3). Spin-coat the mixture of the CuSCN nanoparticles and the QDs on the TFB holes transport layer, and form a QD light-emitting layer containing the CuSCN nanoparticles;

4). Followed by spin-coating a layer of the ZnO electrons transport layer on the QD light-emitting layer;

5). Finally, an Al cathode is evaporated on the ZnO electrons transport layer, to obtain the QD light-emitting diode.

EXAMPLE 4

1) Prepare a mixture of the CuSCN and the QDs: dissolve 0.05 mg CuSCN powder and 20 mg CdSe@CdS@ZnS QDs in 1 mL n-octane, mix well and form a uniform mixture.

2). A plurality of preparation steps of the QLED device is as follows: spin coat a layer of the PEDOT:PSS holes injection layer on the ITO substrate; spin coat a layer of the poly-TPD holes transport layer on the PEDOT:PSS holes injection layer;

3). Spin-coat the mixture of the CuSCN nanoparticles and the QDs on the poly-TPD holes transport layer, and form a QD light-emitting layer containing the CuSCN nanoparticles;

4). Followed by spin-coating a layer of the ZnO electrons transport layer on the QD light-emitting layer;

5). Finally, an Al cathode is evaporated on the ZnO electrons transport layer, to obtain the QD light-emitting diode.

All above, the present disclosure provides a QD light-emitting diode and a preparation method therefor, and a light-emitting module and a display apparatus. The present disclosure blends the QDs and the CuSCN nanoparticles into a membrane to prepare the QD light-emitting layer, and passivates a hole trap state on a surface of the QDs, as well as improving a transport effect of the holes, making an injection of the holes and the electrons in the QLED achieve a balance, thus improving a light-emitting efficiency and a stability of the QLED.

It should be understood that, the application of the present disclosure is not limited to the above examples listed. Ordinary technical personnel in this field can improve or change the applications according to the above descriptions, all of these improvements and transforms should belong to the scope of protection in the appended claims of the present disclosure.

What is claimed is:

1. A quantum dot (QD) light-emitting diode, wherein comprising an anode, a cathode, and a QD light emitting layer arranged between the anode and the cathode;

wherein a material of the QD light-emitting layer comprises a plurality of QDs and a plurality of cuprous thiocyanate (CuSCN) nanoparticles, and a mass ratio between the QDs and the CuSCN nanoparticles is in a range of 0.001~20:1.

2. The QD light-emitting diode according to claim 1, wherein further comprising a holes injection layer arranged between the anode and the QD light emitting layer, a holes transport layer arranged between the holes injection layer and the QD light-emitting layer, and an electrons transport layer arranged between the cathode and the QD light-emitting layer, the holes transport layer overlays the QD light-emitting layer.

3. The QD light-emitting diode according to claim 1, wherein a thickness of the QD light-emitting layer is 10~100 nm.

4. The QD light-emitting diode according to claim 1, wherein a size range of the CuSCN nanoparticles is 0.5~50 nm.

5. A display apparatus, wherein comprising the QD light-emitting diode according to claim 1.

\* \* \* \* \*